United States Patent [19]

Cho et al.

[11] Patent Number: 4,626,775
[45] Date of Patent: Dec. 2, 1986

[54] RADIO FREQUENCY PROBING APPARATUS FOR SURFACE ACOUSTIC WAVE DEVICES

[75] Inventors: Frederick Y. Cho, Scottsdale, Ariz.; Michael D. Adamo, Wilbraham, Mass.; David E. Leeson, Tempe, Ariz.

[73] Assignee: The United States of America as represented by the Secretary of the Air Force, Washington, D.C.

[21] Appl. No.: 607,087

[22] Filed: May 4, 1984

[51] Int. Cl.$^4$ .................. G01R 31/02; G01R 31/28
[52] U.S. Cl. ..................... 324/73 R; 324/158 F; 324/158 P; 324/158 R
[58] Field of Search ............ 324/73 R, 158 F, 158 P, 324/158 R

[56] References Cited

U.S. PATENT DOCUMENTS

| | | | |
|---|---|---|---|
| 3,439,273 | 4/1969 | Sills | 324/125 |
| 3,590,375 | 6/1971 | Sills | 324/154 R |
| 3,919,632 | 11/1975 | Roerty | 324/125 |
| 3,932,809 | 1/1976 | Frank | 324/96 |
| 4,116,523 | 9/1978 | Coberly et al. | 324/158 P |
| 4,140,968 | 2/1979 | Barry | 324/125 |
| 4,161,692 | 7/1979 | Tarzwell | 324/158 P |
| 4,390,837 | 6/1983 | Hotvedt | 324/73 R |

OTHER PUBLICATIONS

Faran, Jr., J. J.; "Methods of Assignments ... "; 1982 IEEE Test Conference; 1982; pp. 641-647.

Primary Examiner—Ernest F. Karlsen
Attorney, Agent, or Firm—Donald J. Singer; Gerald B. Hollins

[57] ABSTRACT

Wafer probing apparatus especially adapted to probing surface acoustic wave (SAW) device die such as delay lines is disclosed; the apparatus includes a probe card especially suited to the radio frequency and multiple output nature of a SAW delay line together with a computer-aided electronic system for exciting the delay line and evaluating its output.

20 Claims, 5 Drawing Figures

RADIO FREQUENCY PROBING APPARATUS FOR SURFACE ACOUSTIC WAVE DEVICES

RIGHTS OF THE GOVERNMENT

The invention described herein may be manufactured and used by or for the Government of the United States for all governmental purposes without the payment of any royalty.

CROSS REFERENCES TO RELATED APPLICATIONS

This application is one of a group of three filed on the same date concerning somewhat related inventions. The other two applications are identified by Ser. No. 06/607,098 and Ser. No. 06/607,094.

BACKGROUND OF THE INVENTION

This invention relates to the field of electronic circuit device testing and to radio frequency testing of surface acoustic wave die on a wafer.

Computer controlled automated probing of die on semiconductor wafers has been extensively used in the electronic circuit art for digital, analog, radio frequency, and discrete semiconductor components. The specialized technical problems and smaller degree of commercial activity associated with surface acoustic wave devices, including especially surface acoustic wave delay lines, has limited the feasiblility and the need for applying such probing to surface acoustic wave devices. A program has been sponsored by the United States Air Force to advance the art in manufacturing surface acoustic wave devices in order that reliable and low cost devices of this type be available for military signal processing needs; this program has initiated the extension of probing technology to the special needs of surface acoustic wave devices.

Surface acoustic wave delay lines are often fabricated on two or three inch probe accessible wafers that are made from such material as lithium niobate; usually each wafer contains forty or more delay lines with each delay line having two or more electric-to-acoustic and acoustic-to-electric transducers incorporated. Many such delay lines, for example, have a single input transducer and a plurality of output transducers located at intermediate delay points along the path traveled by the surface acoustic wave through the acoustic substrate. Frequently, each of the transducers will have a number of electrodes which are fabricated in the form of interleaved fingers.

The prevailing practice in the delay line manufacturing art is to visually inspect a wafer of delay line die in order that manufacturing defects such as improper etching, mask misalignment, and improper metallization be identified before the expense of further fabrication and packaging is incurred. Visual inspecting times of several minutes for each wafer are not uncommon—with the inspection results being greatly dependent upon the experience and fatigue level of the inspector.

The large volume manufacture of reliable surface acoustic wave devices clearly needs a replacement or supplement for this variable and expensive human oriented inspection practice. The computer-controlled automated probing used in the integrated circuit art appears to offer a ready solution to such human oriented inspection difficulties, however, the differences between a surface acoustic wave device and most integrated circuit devices has precluded an immediate adoption of integrated circuit probing techniques in the surface acoustic wave art.

The prior patent art includes numerous examples of computer-controlled and automated test equipment applied to analog and digital components and systems made from these components. In particular, U.S. Pat. No. 4,390,837 issued to Kevin Hotvedt is an example of automated testing involving digital and analog technology and the use of an oscilloscope display of test waveforms. Similarly, U.S. Pat. No. 4,196,386 issued to Donald E. Phelps concerns a test apparatus which uses a high speed processor to control the testing of digital printed circuit boards.

U.S. Pat. No. 4,108,358 issued to Casimer Niemaszyk also concerns a computer-controlled test apparatus for printed circuit cards and the like and employs the concept of a pin electronics package located near the device under test and remote from the controlling computer's main frame.

SUMMARY OF THE INVENTION

An object of the present invention is to provide testing for surface acoustic wave devices that remain in unsegregated wafer form.

A further object of the invention is to provide radio frequency test apparatus suitable for probing of surface acoustic wave devices.

Another object of the invention is to provide a probe card arrangement suitable for radio frequency testing of surface acoustic delay lines.

DETAILED DESCRIPTION

Figure 1:
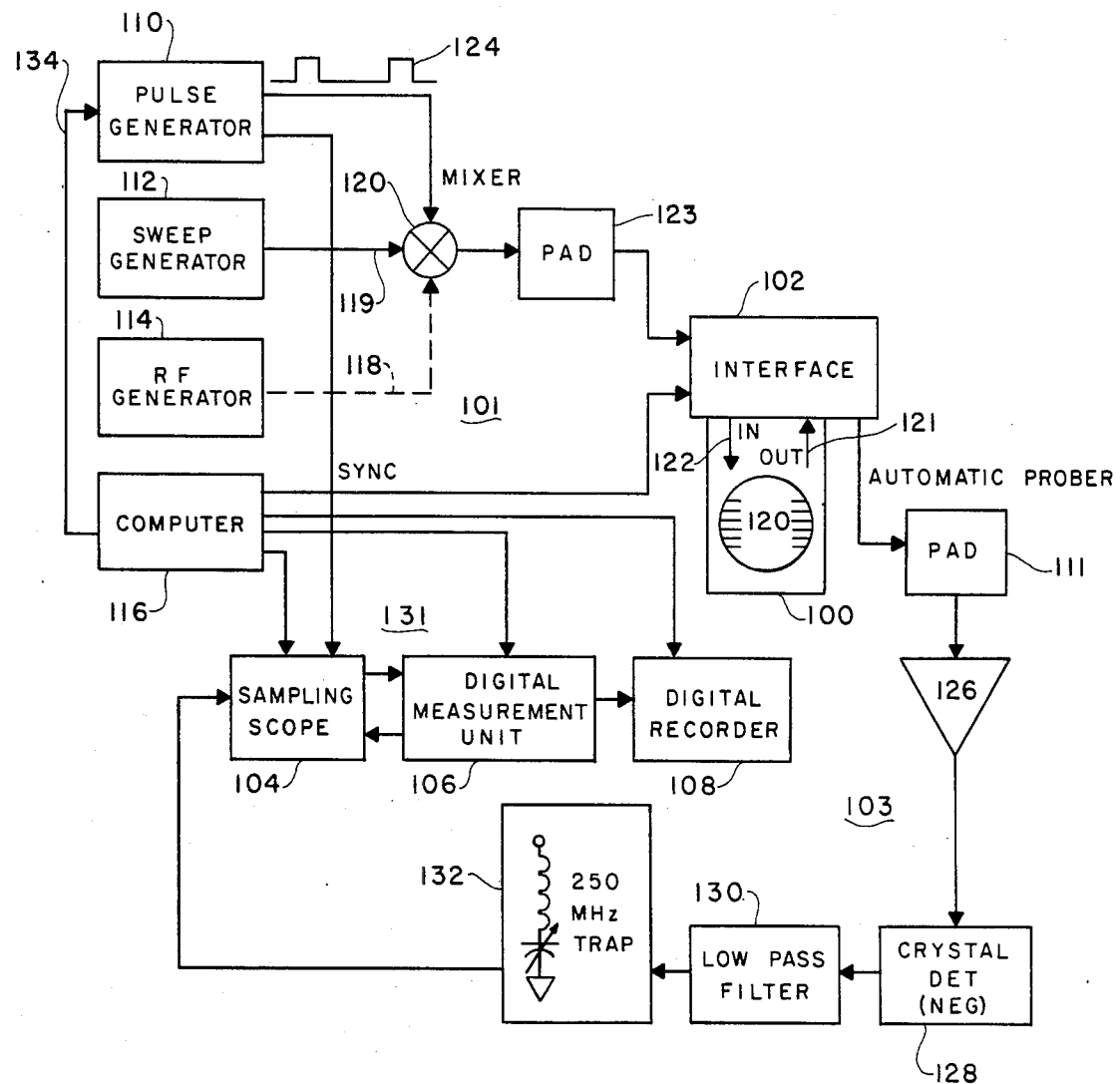
FIG. 1 is a block diagram of a surface acoustic wave probing apparatus.

FIG. 1 shows the major electrical components used in a computer-controlled appartus for probing surface acoustic wave delay line wafers. The FIG. 1 apparatus includes an automatic probing mechanism 100 which is electrically coupled by an interface 102 to a source of input signals—generally indicated at 101, and to an output signal evaluating apparatus generally indicated at 103.

The input signal source 101 in FIG. 1 includes a source of digital pulse signals 110, a source of swept radio frequency signals 112, a source of digitally controllable radio frequency signals 114 and a computer 116. The input signal source 101 also includes a signal mixer 120 and a signal isolating attenuator or pad 123.

The output evaluatiing circuitry 103 is shown to include a signal isolating attenuator or pad 111, a radio frequency amplified 126 and a modulation detector 128. The evaluation circuitry also includes a low pass filter 130 and a selected frequency trap circuit 132. The evalutating circuitry also incorporates at 131 measuring and communications apparatus which includes a sampling oscilloscope 104, a digital measuring unit 106, and a digital recorder or printer 108.

The automatic wafer prober 100 includes an electromechanical apparatus for accurately controlling the relative position of a wafer being tested with respect to a set of aligned electrical contacts or probes. The probes conduct signals into and away from the circuit undergoing test on the wafer 120. The ability to change the relative position of the wafer 120 and these probes in precisely determined increments and at high speed is incorporated in the probing mechanism 100. This ability allows rapid testing of the individual circuits or die on the wafer 120 in order that a wafer containing, for example, forty individual circuits be testable in a rapid and automatic sequence. Probing equipment suitable for use in the FIG. 1 apparatus is available from several manufacturers, the Model 910 Prober made by Electroglas Inc., of 2901 Stender Way, Santa Clara, CA 95051, has been found especially suitable for this use. Additional details of the probing mechanism are described below in connection with FIG. 2.

The input signal to each tested die of a wafer on the probing mechanism 100 is indicated at 122 in FIG. 1. The signal 122 includes a radio frequency carrier component as is required by the characteristics of a surface acoustic wave delay line. Additional details concerning the characteristics of a surface acoustic wave delay line and fabrication of such devices is contained in my two copending applications, which include other coinventors, and which are identified as the somewhat related applications above the disclosures of these two patent applications is hereby incorporated by reference into the present specification.

Both a pulse modulated swept radio frequency signal and a discretely variable radio frequency signal are useful in the FIG. 1 probing apparatus, the latter because one contemplated use of this apparatus involves the rapid screening of wafer die for determining functionality without regard for small response abberations. For such rapid screening use, it is found convenient to submit each tested die to discrete radio frequency carrier signals which are located across the bandpass of the surface acoustic wave (SAW) device being tested. Such screening presumes that satisfactory response to the selected frequencies is indicative of die performance meriting further processing and assembly of the die. For screening operation, the radio frequency generator 114 in FIG. 1 is employed, this generator is frequency controlled by a signal which is not shown but which functions to select several discrete frequencies.

In order to measure the time required for a particular input signal to propagate through a surface acoustic wave device it is found convenient to modulate or mix the radio frequency input signal with a pulsed waveform and thereby provide a series of radio frequency bursts which can be conveniently identified in the output of the SAW device. In selecting the timing of these radio frequency bursts it is found desirable to separate successive bursts by a time period sufficient to exceed the duration of echoes and reflected signals in the output of the SAW device. In FIG. 1, the bursts of radio frequency signal are achieved by modulating or mixing the radio frequency signal with a digital signal provided by the pulse generator 110 using the mixer 120. For surface acoustic wave delay line use, the output waveform of the pulse generator 110 which is indicated at 124 in FIG. 1, is selected to have a pulse repetition frequency near 6.5 microseconds and a pulse width near 300 nano-seconds, other pulse frequencies and pulse durations can, of course, be employed where required by the SAW device being tested.

For uses of the FIG. 1 apparatus which require a more complete evaluation of the SAW device it is found convenient to employ a radio frequency signal which changes or sweeps over the frequency band of interest. A source of swept radio frequency signals is indicated at 112 in FIG. 1 and is shown coupled over the path 119 to the mixer 120. For use with one particular SAW device, of the delay line type, a swept radio frequency signal centered at 250 megahertz has been found suitable; together with a pulse generator output of 0.5 to 1.2 volts and a radio frequency output level of 0 dbm.

The path 118 from the radio frequency generator 114 in FIG. 1 is shown dotted to indicate that one or the other but not both of the signal generators 112 and 114 is to be active during a given test. Switching between the two possible generators can be accomplished with electronic switching which is not shown or by a manual changing of connections.

For fabricating the input signal source 101 in FIG. 1 several pieces of commercially available equipment are found to be convenient. The mixer 120 in FIG. 1, for example, may conveniently be a type 1054A mixer manufactured by Hewlett-Packard Corporation of 1501 Page Mill Road, Palo Alto, CA; the computer 116 may be a Hewlett-Packard type 2114B and the sweep generator 112 may be a Wavetek Inc., model 3000 manufactured by Wavetek Ind., Inc., 66 North First Avenue, PO Box 190, Beech Grove, Ind. 46107. The attenuators or pads 123 and 111 in FIG. 1 can also be obtained from Hewlett-Packard Corporation as standard 3 db radio frequency attenuating pads. These pads serve to eliminate mismatch, standing waves, and reflections between the SAW under test and its driving and loading circuitry at 101 and 103 in FIG. 1. The use of pad isolating devices minimizes the effect of the imperfect impedance match inherent in coupling to and from the SAW device under test.

The signal output of the SAW device is indicated at 121 in FIG. 1 and is shown to be coupled through the 3 db pad 111 to a radio frequency amplifier 126, which has a gain of about 55 db, and thence to a crystal type modulation envelope detector 128. The output of the crystal detector 128 is coupled through a low pass filter, which may be a three-pole combination of L and C elements as shown at 418 in FIG. 4, to a 250 megahertz trap 132 and thence to the Y deflection input of the sampling oscilloscope 104. The low pass filter 130 serves to reconstruct the modulation envelope of the signal detected by the crystal detector 128 by passing the low frequency modulation components while attenuating the high frequency or carrier components. The 250 megahertz trap 132 further removes the radio frequency carrier components from the detected signal in order that the information displayed on the oscilloscope 104 be stable and nonjittering in nature. The 250 megahertz trap 132 may be fabricated as a series resonant circuit with a "Q" value selected to reject the band of frequencies covered by the sweep generator 112. A representation of this series resonant circuit is shown in block 132 in FIG. 1. The design of an appropriate trap circuit is an established procedure in the electrical filter art. The crystal detector 128 may be embodied as a type 423A crystal detector manufactured by Hewlett-Packard Corporation. The low pass filter 130 serves to reduce the jitter of the 250 megahertz signal due to incoherent phase gating to less than 5%.

The oscilloscope 104 in the measuring and communicating elements 131 may be embodied as a Tektronics type 568 sampling oscillioscope, the digital measuring unit 106 as a Tektronics type 230 digital measurement unit and the digital recorder 108 as a Tektronics type 5050B recorder; these devices are available from Tektronics, Inc., of Portland, Oreg. As indicated in the Tektronics, Inc., literature concerning these components, which is hereby incorporated by reference into the specification, the combination of the sampling oscilloscope 104 and the digital measuring unit 106 is capable of displaying waveforms from the delay line under test and performing comparison of the output signal with predetermined tolerance limits; the results of this comparison are printed on paper by the digital recorder 108.

Several of the elements in FIG. 1 include self-contained power supplies, this being the case for the sweep generator 112, the computer 116 and the measuring and communicating elements 131. Certain other of the FIG. 1 elements, especially the interface 102 and the amplifier 103, require external power supplies which are not shown in FIG. 1, such power supplies are well known in the eletronic art.

Several of the FIG. 1 elements including the measurement and communicating elements 131, the interface 102 and the pulse generator 110 are shown to have communication with the computer 116 for initiating and controlling the function of the system and for providing system information flow. A detailed description of the software employed in the computer 116 for performing these and other functions is provided in connection with Table I below.

Figure 2:
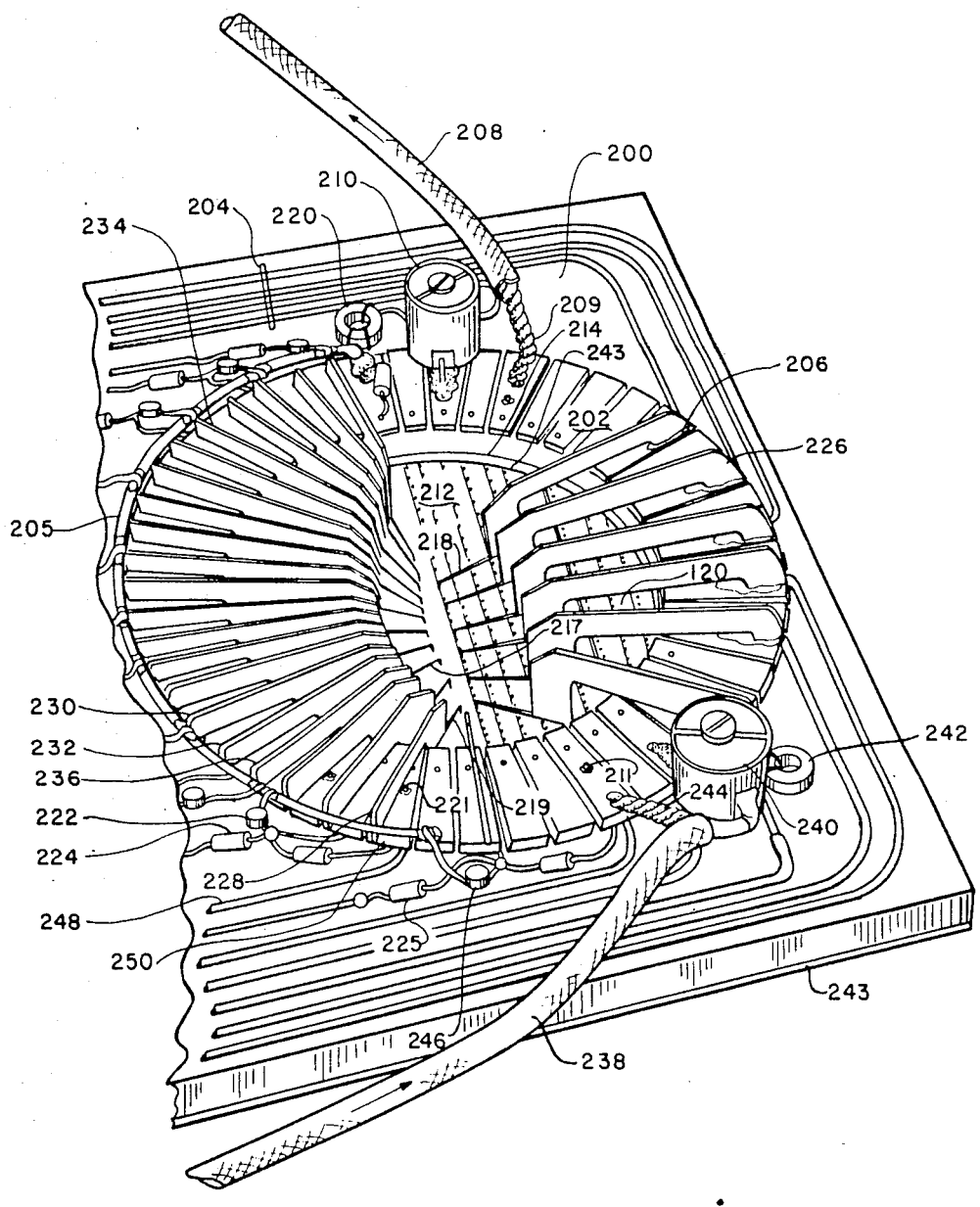
FIG. 2 shows a probe card that is usable with a surface acoustic wave probing apparatus.
Figure 3:
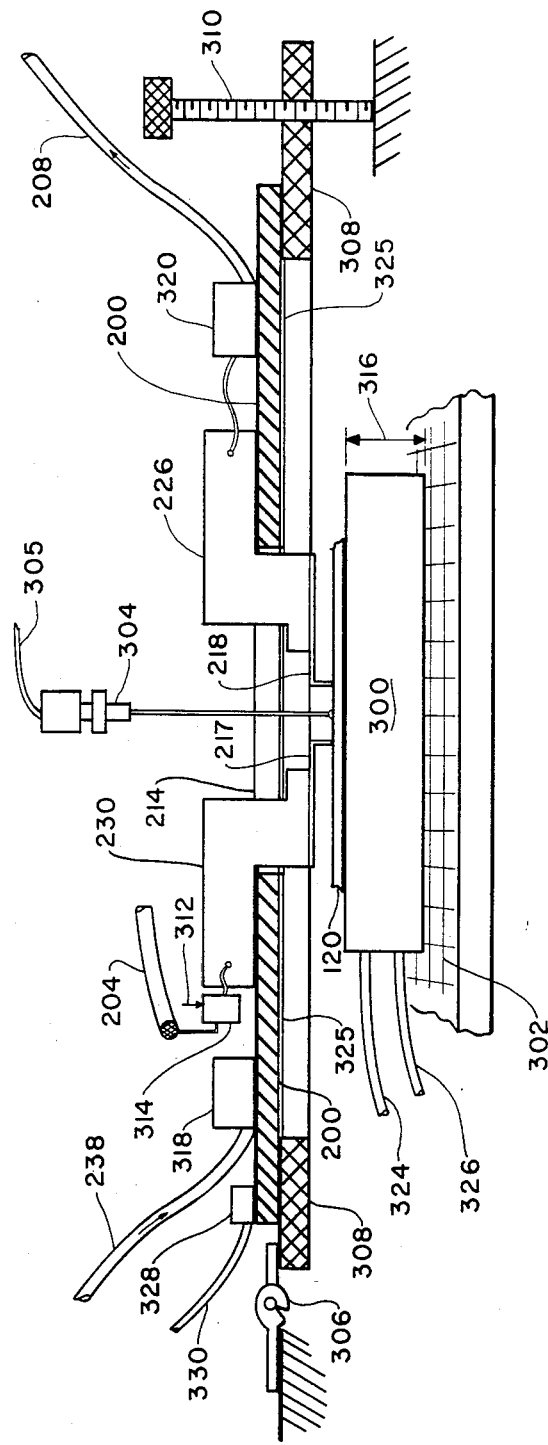
FIG. 3 shows additional details of the probe card and attending portions of the probing apparatus.

The probe card used with the automatic probing mechanism 100 to achieve quick, reliable, and repeatable electrical connection with a sequence of die on the wafer 120 is shown in FIGS. 2 and 3 of the drawings. Suitable blanks or starting point probe cards for fabricating the FIGS. 2 and 3 card are available commercially from several manufacturers; such cards include the model C-2300L manufactured by Wentworth Laboratories, Inc., of Brookfield Ct. The FIGS. 2 and 3 probe card consists of an insulating substrate board 200 into which is cut an aperature 214 for receiving a series of cantilever supported conductor arms 226–236 that in turn support a group of probe pin contact fingers shown typically at 217–219 in FIG. 2. The probe pin contact fingers are used for making electrical contact with die 212 on wafer 120.

The electrically insulating substrate board 200 includes a series of radially disposed land areas 202 and a group of conductor stripes 204 which convey electrical signals from a nonshown connector at the edge of substrate board 200 to the cantilever arms 226–236. The probe pins 217–219 make pressure contact with the metallic connection pads on the die 210. The cantilever arms 226–236 are attached to the land areas 202 by way of soldering, or mechanical attachment as is generally indicated at 206 in FIG. 2. The alignment and positioning of the cantilever arms 226–236 and the contact ends of the probe pins 217–219 is usually accomplished with a high degree of precision, and to dimensions within one or two one-thousandth of an inch in order to assure predictable positioning and contact pressure for the probe pin contact ends.

Additional details of the FIG. 2 probe card are to be understood by comparison of the perspective and cross-sectional views of the card in FIG. 2 and FIG. 3, respectively. Additional features which are needed in probing a radio frequency excited surface acoustic wave device such as a delay line are also shown in FIG. 2 and FIG. 3. These elements include coaxial cable transmission lines 208 and 238 for communicating output and input signals with a SAW device under test together with capacitor and inductor members 240, 242 and 210, 220 for terminating and matching these coaxial transmission lines with the input and output of the SAW device under test. These terminating and matching elements are shown in blackbox form at 318 and 320 in FIG. 3.

In order that the measuring and communicating apparatus 131 in FIG. 1 receive signals from only a single delay line tap during a particular test, the FIGS. 2 and 3 probe card includes an electronic switching or commutating arrangement for conveying the selected signal of one probe pin to the measuring and communicating apparatus 131 while rejecting the remaining signals. Elements of this electronic switching arrangement include an output bus member 205, the typical diodes 222 and 246 and the typical resistors 224 and 225, these elements are shown in simplified black-box form at 314 in FIG. 3 and are shown in electrical schematic form in FIG. 4 of the drawings. Semiconductor devices other than diodes and other circuit arrangements could, of course, be used for this switching or commutating function.

Another feature of the SAW device probe card, the output bus 205, is shown to be mounted from two unused land areas of the card in FIG. 2; this bus is desirably located in close proximity to the cantilever arms 226–236 and the die under test 212 in order that stray coupling and loading of the radio frequency signals be minimized and in order that the effective impedance of the switching network remain as constant as possible when different output taps are selected for measurement.

Figure 5:
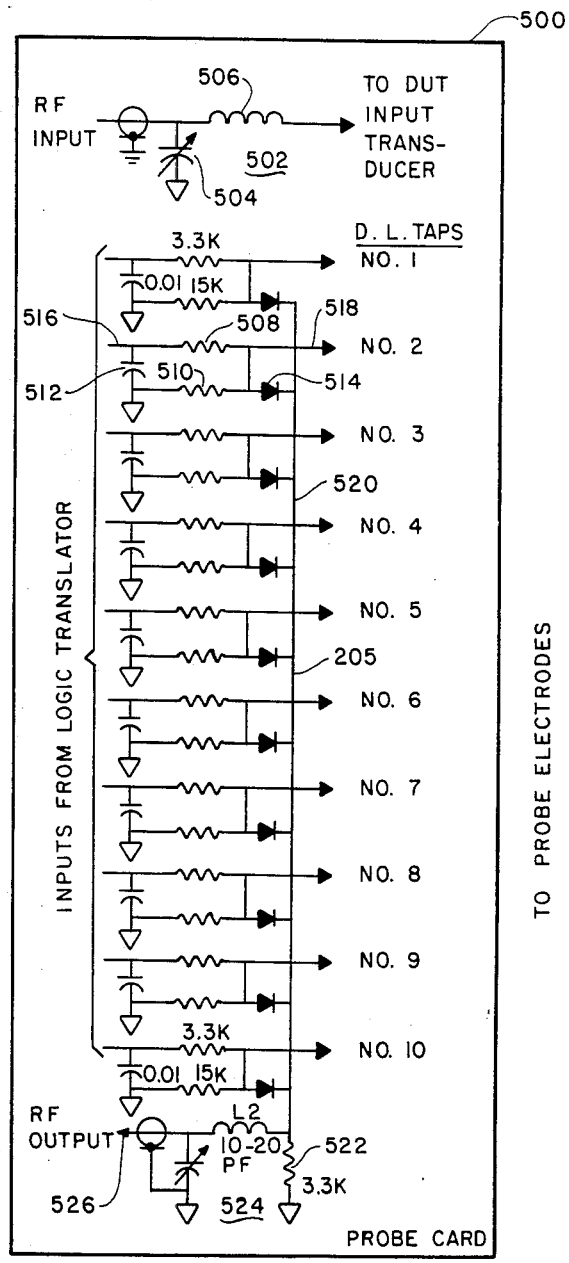
FIG. 5 is an electrical schematic diagram of portions of the probing apparatus which are located on the probe card.

Impedance matching between the SAW device under test and the output coaxial cable 208 is accomplished to a reasonable degree by use of the inductor 220 and the variable capacitor 210 which are connected in an inductive input matching network as shown at 524 in FIG. 5. Use of the attenuating pad 111 in FIG. 1 further assists in achieving a desirable coupling between the SAW device and succeeding elements of the FIG. 1 apparatus. Impedance matching at the input of the SAW device under test is similarly accomplished with the capacitor 240 and the inductor 242 and the attenuating pad 123 in FIG. 1. The selection of appropriate values for the impedance matching elements is known in the electrical art, the adjustable nature of the capacitors 210 and 240 allowing for fine tuning adjustment of this match.

Additional features of the FIGS. 2 and 3 apparatus are useful in accommodating the radio frequency and multiple signal nature of the SAW delay line in a probing enrivonment; these features include the use of ground-connected dummy cantilever arms such as the arm 232. These dummy or shielding cantilever arms are not provided with a probe pin such as the pins 217–219 and are interspaced between adjacent signal-conducting cantilever arms for shielding purposes in order that the capacitance and stray radio frequency coupling between adjacent arms such as the arms 230 and 236 be reduced. The ground connection of these dummy or shielding cantilever arms in FIGS. 2 and 3 is not shown in the interest of drawing clarity, such connection can be made through the use of additional bus conductors such as the bus 205 or through the use of a second layer printed circuit conductor as shown at 243 in FIGS. 2 and 3.

An additional accommodation of the radio frequency and multiple output port nature of a SAW delay line device in the FIGS. 2 and 3 probe card includes the use of multiple ground-connected probe pins for contacting the commonly connected ground pads of the SAW device output ports in order that ground difference potentials be minimized. In the preferred embodiment of the invention, for example, where a delay line having one input port and ten output ports for delay line taps, it is found desirable to provide one ground pin for the input transducer and ten ground pins for the commonly connected ground bar of the output transducers together with eleven pins for the radio frequency signals (one input and ten output), and a ground shield pin between each of the eleven radio frequency signals pins. A desirable arrangement for connecting the dummy or shielding cantilever arms such as the arm 232, the coaxial cable shields 209 and 214, and the commonly connected ground bar cantilever arms is to connect all of these elements to the second layer printed circuit conductor 243 by way of conductors of the type shown at 211 and 221. The conductors 211 and 221 pass through the substrate board 200 and are connected by soldering to the second layer and top conductors. In this arrangement the second layer printed circuit conductor 243 becomes a ground plane and can be the common ground point for the FIG. 1 apparatus. The conductor stripes 204 may additionally be arranged in an alternating ground and active conductor configuration to simultaneously shield signals and convey ground potential to the active area of the probe card.

Additional details of the FIGS. 2 and 3 probe card apparatus which are not shown in FIG. 2 include the mounting frame 308 which is shown attached to a hinge and a leveling screw arrangement 306 and 310, together with the wafer holding, elevating and moving apparatus 300. The hinge arrangement 306 permits pivoting of the probe card up and away from the wafer area and enables a parallel plane relationship between the wafer to be tested and the probe card by way of the leveling screw 310.

The holding, elevating and moving apparatus 300 includes a source of vacuum 324, which is found convenient for retaining a wafer fixed on the apparatus 300, and a source of compressed air 326 which may be used as a lubricant medium between the holding, elevating and moving apparatus and its traveling plane. The traveling plane for the apparatus 300 includes a magnetic stripe grid 302 which forms a part of a linear electric motor structure used for positioning successive die on the wafer 120 with respect to the typical probe pins 217, 218 and 219. The holding, elevating and moving apparatus 300 also includes some arrangement for achieving a Z-axis elevation relationship between the wafer under test and the probing pins, this elevation is diagrammatically illustrated by the arrow 316 in FIG. 3 and desirably is arranged to deflect the probe pins by a distance exceeding three milli-inches (for pads of 2000 angstroms thickness). Deflecting in the neighborhood of four milli-inches has been found to produce reliable and repeatable low resistance connections for such pads. Other probe card mounting arrangements and wafer holding, elevating and moving arrangements can, of course, be employed.

FIG. 3 also shows a connector 328 and a cable 330 which are used to make electrical connections to the conductor stripes 204 on the probe card. FIG. 3 also indicates at 312 the presence of control signals for effecting operation of the semiconductor switching element diodes 222 and 246 in FIG. 2. These control signals may be communicated to the probe card by way of the cable 330 and the connector 328. FIG. 3 also shows an inker mechanism 304 which is electrically actuated by way of the leads 305 to apply a drop of liquid ink to a die that has been found defective. The ink drop permits die segregation during a subsequent separation and assembling operation of the SAW device. In the case of SAW delay lines fabricated on a lithium niobate structure, a liquid ink such as Carter's Stamp Pad Ink No. 414 manufactured by Carters Ink Company of Cambridge, Mass 02142 has been found acceptable for use in the inker mechanism 304; an ink of this type is capable of liquid application and of ready removal where rework of a wafer having low yield of good die is desired. Frequently, die rework can involve stripping off the electrical-to-acoustic transducer metal layers and applying new transducer metal in order to save the cost of discarding an entire wafer. The circuitry for actuating the inker mechanism 304 in response to a determination of a defective die at the measuring and communications apparatus 131 is well known in the electrical art.

Figure 4:
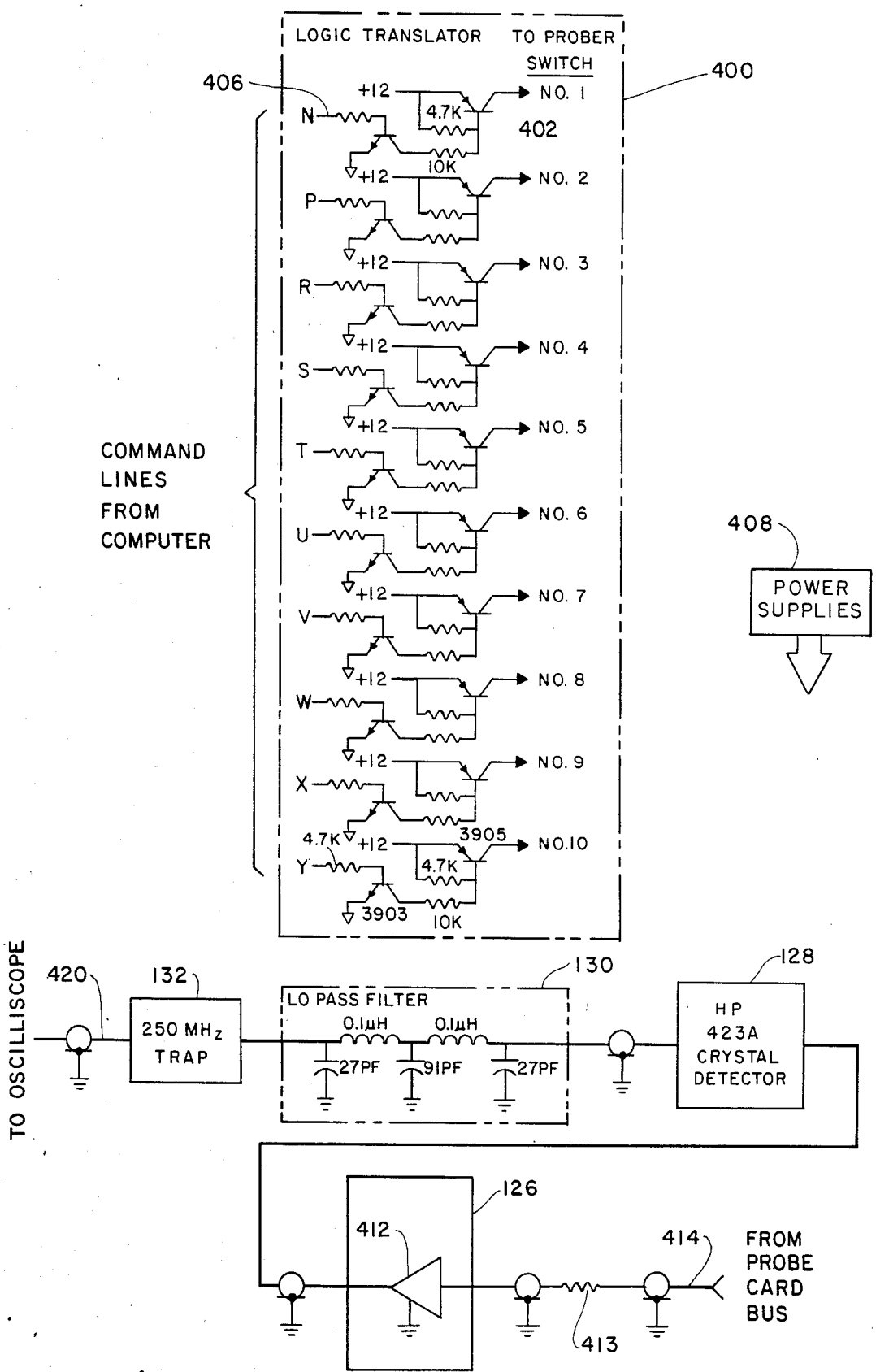
FIG. 4 is a block diagram and electrical schematic diagram of portions of the probing apparatus which are located remote from the probe card.

FIGS. 4 and 5 of the drawings show additional electrical details of the present embodiment and also repeat portions of the FIG. 1 apparatus in order to present a better overall view of the invention. At 500 in FIG. 5, for example, there is shown an electrical schematic diagram of the elements contained on the probe card shown in FIGS. 2 and 3 of the drawings. The FIG. 5 schematic includes the electrical network 502 for matching the signal source to the input of the SAW device under test, this network includes the capacitor 504 and the inductor 506 which correspond to the elements 240 and 242 in FIG. 2. For matching a coaxial cable of to the described SAW delay line a matching circuit was chosen for two and one-half pair electrodes that are frequency centered at 250 megahertz and employ a capacitor value of 10–20 picofarads and an inductor which consists of four turns of number 30 wire on a T20-12 size core. Torroidal cores of this type are available from Micrometals Company of 72 East Montecito Avenue, Sierra Madre, CA 91024.

The probe card circuitry 500 also includes the ten electronic switching or commutating circuits for selectively connecting one of the SAW device outputs to the bus 205 in response to logic input signals received on control lines such as line 516. The electronic switching circuits are shown to include a plurality of diodes, such as the diode 514, which can be selectively forward-biased by way of a positive-going signal received on the line 516. The line 516 supplies a diode forward current of between 3 and 4 milliamperes, this magnitude is determined by the 3300 ohm value shown for the resistor 508. The resistor 510 in FIG. 5 is used to hold the anode of diode 514 near ground potential in the absence of a selecting signal at the line 516. The capacitor 512 in FIG. 5 reduces the tendency of noise signals to cause undesired forward conduction in the switching diode 514. The bias current in diode 514 established by current flow in the resistor 508 is modulated in both the increasing and decreasing directions by the delay line signal appearing on line 518 from tap number 2 of the delay line.

Signal from the bus 205 is applied to the coupling and matching network 524 and to the residual load resistor 522. Signal from the output of the coupling and matching network 524 appears on the conductor 526 and is applied to the 3 db attenuator pad 413 in FIG. 4, this attenuator pad is also shown in block form at 111 in FIG. 1.

FIG. 4 of the drawing shows additional circuitry used in the invention. The amplifier 126 which appears in both FIG. 4 and FIG. 1 may be comprised of four tandem connected individual amplifier circuits such as the AH 591, a pair of AH 592 amplifiers and a AH 593 output amplifier all as manufactured by Optimax Inc. of PO Box 105, Advance Lane, Colmar, PA 18915. A total gain of approximately 54 db is found desirable for the amplifier 126 in order to accommodate transducer losses, system losses and provide adequate signal level for computer analysis.

Following the amplifier 126 is the crystal detector 128 and the low pass filter 130. The preferred crystal detector is manufactured by Hewlett-Packard and identified as a type 423A detector. The low pass filter 130 may be fabricated from standard components using two series inductances of one-tenth microhenry and shunt capacitances of 27, 91 and 17 picofarads as shown at 130 in FIG. 4. Signal from the low pass filter 130 is applied to the oscilloscope 104 in the measuring and communications apparatus 131 after having any residual components of the radio frequency carrier removed by the trap 132.

Also shown in FIG. 4 is a group of two-transistor logic translator circuits 400 which are used to couple computer control signals to the probe card switching network 500 in FIG. 5. The logic level translator circuits 400 include a PNP and NPN transistor connected in tandem by a resistor network. One voltage translator circuit is used to connect each of the diode switching networks in FIG. 5 to the computer. The voltage level translator circuits 400 in FIG. 4 also provide signals of suitable large voltage swing and noise immunity for coupling to the diode switching network 500.

Computer Program

The computer 166 in FIG. 1 is used to store and communicate limit values for the measuring and communicating apparatus 131 and to sequentially access the different taps of the SAW delay line under test by way of the circuitry shown at 400 and 500 in FIGS. 4 and 5. The preferred computer 116, a type 2114B manufactured by Hewlett-Packard Corporation, is initially programmed with standard executive software supplied by Hewlett-Packard or other executive software commercial suppliers. The individualized test program listed in Table I herein may be loaded into the 2114B computer following executive loading in order that the computer and the measuring and communicating apparatus 131 be adapted to performing the SAW delay line functions described above. Clearly, these described functions could also be performed by specially designed electronic hardware rather than the general purpose 2114B computer and the Table I program.

A major portion of the Table I program is comprised of a repeating sequence of six instructions such as the instructions between lines 036 and 041. These instructions serve to identify the test number—the T03 instruction; set up the desired delay line switch element at 500 in FIG. 5,—the C2004 instruction; and instruct the measuring and communicating apparatus 131 with regard to the time location in the oscilloscope trace to be examined,—the S19,1080 line. The W 20 line provides a 20 millisecond delay interval to allow settling out of the measuring equipment and the M command in line 040 executes a measurement. The L command in line 041 indicates the upper and lower voltage limits in millivolts to be observed on the oscilloscope trace.

As will be seen by examining the Table I program, this six step sequence is repeated ten times, once for each of the ten outputs expected from the delay line under test.

In the first of these ten testing sequences several additional steps are incorporated for accomplishing setup and initialization of the computer and the measuring and communicating apparatus 131. The setup functions include the S instructions between lines 7 and 26; each of these provide an input parameter to the sampling oscilloscope 104, the digital measuring unit 106 and the digital recorder 108. One of these instructions, the S 19 instruction at line 25, was updated above at line 32 for performing the second test. The I command at line 5 in Table I initializes the communicating and measuring apparatus 131 while the O and R commands in line 3 and 4, respectively, are concerned with retaining a relay matrix box in a one-for-one unused condition for the present SAW delay line tests. This relay box is not shown in the present disclosure since it performs one for one connections. The 2095 number in line 1 of Table I provides an identification for the program.

As can be understood by an examination of Table I program listing, the computer in the FIG. 1 apparatus is concerned with the mechanics of performing time and amplitude measurements on a delay line under test. As previously indicated, these measurements can also be accomplished manually or by electronic hardware based systems rather than by programmed general purpose digital computer used in the described embodiment.

TABLE I

| 001 | *2095 300 M | 045 | W 20 |
|---|---|---|---|
| 002 | T 01 | 046 | M |
| 003 | O 3 | 047 | L −200, −120 |
| 004 | R 0,32 | 048 | T 05 |
| 005 | I | 049 | C 2020 |
| 006 | C 2001 | 050 | S 19,2100 |
| 007 | S 1,000 | 051 | W 20 |
| 008 | S 2,000 | 052 | M |
| 009 | S 3,250 | 053 | L −200, −130 |
| 010 | S 4,7000 | 054 | T 06 |
| 011 | S 5,1 | 055 | C 2040 |
| 012 | S 6,1 | 056 | S 19,2720 |
| 013 | S 7,0 | 057 | W 20 |
| 014 | S 8,0 | 058 | M |
| 015 | S 9,0 | 059 | L −200, −130 |
| 016 | S 10,1 | 060 | T 07 |
| 017 | S 11,1 | 061 | C 2100 |
| 018 | S 12,0 | 062 | S 19,3340 |
| 019 | S 13,0 | 063 | W 22 |
| 020 | S 14,5 | 064 | M |
| 021 | S 15,100 | 065 | L −200, −140 |
| 022 | S 16,6 | 066 | T 08 |
| 023 | S 17,15 | 067 | C 2200 |
| 024 | S 18,58 | 068 | S 19,4170 |
| 025 | S 19,280 | 069 | W 20 |
| 026 | S 20,15 | 070 | M |
| 027 | W 50 | 071 | L −200, −135 |
| 028 | M | 072 | T 09 |
| 029 | L −200, −90 | 073 | C 2400 |
| 030 | T 02 | 074 | S 19,5000 |
| 031 | C 2002 | 075 | W 20 |
| 032 | S 19,680 | 076 | M |

TABLE I-continued

| | | | |
|---|---|---|---|
| 033 | W 25 | 077 | L −200, −135 |
| 034 | M | 078 | T 10 |
| 035 | L −200, −90 | 079 | C 3000 |
| 036 | T 03 | 080 | S 19,5840 |
| 037 | C 2004 | 081 | W 20 |
| 038 | S 19,1080 | 082 | M |
| 039 | W 20 | 083 | L −200, −120 |
| 040 | M | 084 | T 11 |
| 041 | L −200, −100 | 085 | O 3 |
| 042 | T 04 | 086 | R 0.32 |
| 043 | C 2010 | 087 | I |
| 044 | S 19,1480 | 088 | E |

The present invention may be seen then to provide for the convenient and rapid probing of surface acoustic wave devices which operate at radio frequencies and which inherently require considerations not heretofore present in probing arrangements. Using the disclosed apparatus, the time for probing a wafer of SAW delay line die has been reduced to about one-third of that required for a manual inspection of the same wafer.

While the apparatus herein described constitutes a preferred embodiment of the invention, it is to be understood that the invention is not limited to this precise form of apparatus or method and that changes may be made therein without departing from the scope of the invention which is defined in the appended claims.

We claim:

1. Radio frequency wafer probe card apparatus for surface acoustic wave device die having a plurality of radio frequency input and output port pads of differing time delay value comprising:

electrode means, including a plurality of spring loaded die contact fingers suspended on individual mounting arms around an aperture in said probe card and having coplanar contact ends located in coincidence with the distribution of said pads on said die, said contact fingers including ground connected fingers for each of said radio frequency ports and ground connected intermediate members located between adjacent radio frequency port fingers, for conducting radio frequency signals into and away from said surface acoustic wave device die with minimal stray radio frequency coupling;

radio freqeuncy switching means, including a plurality of semiconductor elements located adjacent said mounting arms and responsive to a plurality of external control signals, said semiconductor element being connected between each of said radio frequency output port mounting arms and an adjacent output bus, for selectively connecting one of said surface acoustic wave device output ports of selected time delay value with said output bus;

radio frequency conductor means, including transmission lines connecting said output bus and said input port with external signal apparatus and also including transmission line terminating and impedance matching elements located adjacent said mounting arms, for conveying radio frequency signals to and away from probed surface acoustic wave die.

2. The apparatus of claim 1 wherein said semiconductor elements comprise semiconductor diodes and wherein said apparatus includes binary signal means for forward biasing a selected one of said diodes and conducting radio frequency signal from a selected output port to said output bus.

3. The apparatus of claim 2 further including a plurality of ground connected fingers connectable with a common ground bar on said surface acoustic wave die.

4. The apparatus of claim 3 further including mechanical drive means for positioning said surface acoustic wave die along x, y and z axes with respect to said contact ends.

5. The apparatus of claim 4 wherein said transmission lines are of the coaxial line type and wherein the exterior conductors of said coaxial lines are connected with said ground connected fingers.

6. The apparatus of claim 5 wherein said transmission line terminating and matching elements include inductive and capacitative reactive elements.

7. The apparatus of claim 6 wherein said drive means includes means for driving said die pads against said spring loaded contact ends for a distance exceeding three milli-inches.

8. The apparatus of claim 7 wherein said distance is four milli-inches.

9. Apparatus for testing wafers containing a plurality of wafer mounted surface acoustic wave delay line circuits each having a plurality of output signal ports comprising:

signal source means for supplying pulse modulated radio frequency electrical signals capable of delay evaluation and amplitude evaluation of said delay line circuits;

means, synchronized with said signal source means, for measuring radio frequency electrical output signals received from a tested surface acoustic wave delay line circuit for predetermined signal magnitude and signal delay time characteristics;

probe contactor means for communicating radio frequency input and output signals between said source and measuring means and a sequential plurality of said delay line circuits on a tested wafer;

signal commutating means located adjacent said wafer and said contactor means for connecting said means for measuring with a sequential plurality of said output signal ports on a tested delay line circuit; and control means for initiating test events in said apparatus and communicating predetermined test parameters to said means for measuring.

10. The apparatus of claim 9 wherein said probe contactor means further includes means for connecting a plurality of ground connected electrodes to a tested delay line circuit.

11. The apparatus of claim 10 wherein said probe contactor means includes drive means capable of positioning tested delay line circuits on said wafer with respect to a set of probe contact fingers by movements along a plurality of coordinate axes.

12. The apparatus of claim 11 wherein said signal commutating means includes a plurality of semiconductor switching elements connected between said output signal ports and a signal bus.

13. The apparaus of claim 12 wherein said signal measuring means includes an oscilloscope having a programmable measurement limit input.

14. The apparatus of claim 13 wherein said control means includes means for supplying predetermined limit value data to said programmable measurement input of said oscilloscope.

15. The apparatus of claim 14 wherein said control means includes a programmed digital computer.

16. The apparatus of claim 15 further including inking means for marking defective circuits on a tested wafer with visually discernible indicia.

17. The apparatus of claim 16 wherein said controlled carrier radio frequency signals are swept in carrier frequency about a predetermined center frequency.

18. The apparatus of claim 16 wherein said controlled carrier radio frequency signal and discrete carrier frequencies are within a predetermined band of frequencies.

19. Apparatus for the radio frequency testing of wafer mounted surface acoustic wave delay line circuit die each having a radio frequency input port and a plurality of radio frequency output ports which include a grounded port pad and an active port pad for each port, comprising:

signal source means for supplying pulsed swept carrier radio frequency electrical signals capable of delay characterization and frequency response characterizations of said delay line circuits;

a probe card member including a plurality of spring loaded pad contacting fingers suspended on individual mounting arms through an aperture in said probe card, said contact fingers including signal conducting fingers for each of said active pads and ground connected fingers for each of said grounded pads and ground connected shield members located between adjacent active pad arms;

radio frequency switching means including a plurality of semiconductor switching elements responsive to switching control signals and connected between each of said output port active pad signal conducting fingers and an output signal bus for selectively connecting one of said output ports with said signal bus;

means for measuring radio frequency output signals received from the output ports of a tested die and comparing said signals with predetermined limit values;

signal transmission means including terminating and matching elements connected with said input port active pad finger and with said signal bus for communicating radio frequency signals with said tested die from said signal source means and said means for measuring respectively;

control means for generating said output port selecting switching control signals and for initiating measuring events in said means for measuring.

20. The apparatus of claim 19 wherein said control means further includes means for communicating said predetermined limit values to said means for measuring.

* * * * *